United States Patent [19]

Cox

[11] Patent Number: 4,766,368

[45] Date of Patent: Aug. 23, 1988

[54] CAPACITIVE SENSOR

[76] Inventor: Harold A. Cox, Highway 49 North, Rte. 15, Box 559, Hattiesburg, Miss. 39401

[21] Appl. No.: 913,726

[22] Filed: Sep. 30, 1986

[51] Int. Cl.⁴ ............................................. G01R 27/26
[52] U.S. Cl. .................................... 324/61 P; 73/335; 361/280
[58] Field of Search ................ 324/61 P; 73/335, 336; 361/280

[56] References Cited

U.S. PATENT DOCUMENTS 4,486,811 12/1984 Kamiya et al. ...................... 361/280
4,568,873 2/1986 Oyanagi et al. .................... 324/61 P

*Primary Examiner*—A. D. Pellinen
*Assistant Examiner*—Jeffrey A. Gaffin

*Attorney, Agent, or Firm*—Hubbard, Thurman, Turner & Tucker

[57] ABSTRACT

A capacitive proximity sensor utilizes a laminate capacitive sense head having no active components. The sense head is connected by a coaxial cable to a remotely located capacitive sensor circuit. An ac signal on the inner conductor of the coaxial cable is monitored by the sensor circuit to detect the proximity of an object to the sense head. The outer shield conductor of the coaxial cable is driven by the sensor circuit with an ac voltage corresponding to the ac signal on the inner conductor so as to minimize capacitive loading of the signal on the inner conductor. The laminate capacitive sense head has dielectric and conductive layers. The conductive layers form conductive patterns appropriately connected to the inner and outer conductors of the coaxial cable to provide sense electrode and guard shield functions in a very thin and versatile sensing structure.

6 Claims, 1 Drawing Sheet

CAPACITIVE SENSOR

BACKGROUND OF THE INVENTION

This invention relates to sensors and more particularly to a capacitive sensor having an improved sense head for detecting the presence of objects.

Capacitive sensors for detecting objects in proximity of the sensors are known in the prior art. These sensors have included a sensor head remotely connected to a capacitive loading to ground detection electronic circuit by a shielded wire having an inner conductor and an outer shield conductor such as, for example, a coaxial cable. The signal on the inner conductor is monitored by the electronic circuitry to detect the capacitive loading to ground. A low impedance ac voltage substantially identical to the ac voltage on the inner conductor is applied to the outer shield for minimizing the capacitive loading effect of the shield to inner conductor capacitance.

The sense head in its simplest form is an unguarded electrode attached to the inner conductor. For this sense head to be of practical application, a mounting is required to fix the location of the sense electrode. Problems have existed with the mounting. One mounting method included mounting the electrode in a dielectric cavity to provide a fixed separation between the sense electrode and the mounting base. With the mounting base at ground potential, a substantial capacitance between the sense electrode and ground exists; further this capacitance is subject to change with thermally induced mechanical movement or thermally induced changes in the dielectric constant of the mounting material.

To alleviate the mounting problem of the unguarded system, a guarded system was developed. The guarded system includes a conductive housing connected to a driven guard shield for supporting the dielectric material and the sense head. The conductive housing is in turn attached by means of insulating material to the grounded mounting surface.

An obvious problem attending the structure of the guarded type sensor head is that the additional parts increases the bulk of the sensor head, and the difficulty of fabricating a sensor head of a size to fit in very thin mechanisms such as, for example, in robot end effectors that work in very tight spaces. A second problem is the difficulty of making the sense electrode geometry in various shapes to accomodate special sensing applications, such as, for example, a crescent shape to provide improved resolution when detecting disk shaped objects moving transversely past the sense head. A third problem is the manufacturing expense owing to the series of nesting parts which are generally machined in cup shape and assembled surrounding the sense electrode.

Although in principle the prior art devices and the device of the present invention are substantially the same, the essential difference is the thin printed circuit board sensor head provided by the invention hereinafter described.

SUMMARY OF THE INVENTION

Accordingly, it is an object of the present invention to provide a capacitive sensor having an improved remotely disposed guarded sense head having a size sufficient to fit into very thin working spaces.

Another object of the invention is to provide an improved low cost capacitive sensor having a remotely disposed guarded sense head which is inexpensive to manufacture.

Still another object of the invention is to provide a capacitive sensor which is suitable for mass production having a remotely disposed guarded sense head in shapes to accommodate special sensing applications.

Briefly stated, the capacitive sensor constituting the invention includes a capacitive proximity sensor circuit, a remotely disposed sense head, and a shielded wire operatively connecting the two. A laminate guarded sense head is provided which has connections to both the inner conductor and the outer shield conductor of the shielded wire, the opposite end of which is connected at both the inner conductor and the outer shield conductor to the capacitive proximity sensor circuit. The sense head comprises three layers, two thin conductive layers separated by a dielectric layer. One of the conductive layers has an area which serves as a sense electrode surrounded in the same layer by, but not touching, a conductive path serving as a guard ring. On the opposite side of the dielectric layer is a conductive area which forms a guard plane. The guard plane and the guard ring are connected to the outer shield conductor which is driven by the circuit with a low impedance ac voltage substantially identical to the ac voltage on the inner conductor to which the sense electrode is connected. The signal on the inner conductor is monitored by the capacitive proximity sensor circuit to detect varying capacitance to ground. The guard ring and the guard plane, both being driven by the signal on the outer shield conductor, effectively screen the sense electrode from any stray capacitance that would otherwise be formed through the dielectric layer to ground. Thus, the laminate sense head performs the same electrical function as guarded sense heads fabricated in the conventional manner but achieves the advantage of a very thin structure which has been made less than .010 inch thick. Also the advantages of versatility of shape and economy of manufacture are achieved, especially using printed circuit manufacturing techniques to fabricate the sense heads.

BRIEF DESCRIPTION OF THE DRAWINGS

Other objects and features of the invention will become more readily understood from the following detailed description and appended claims when read in conjunction with the accompanying drawings in which:

DETAILED DESCRIPTION OF A PREFERRED EMBODIMENT

Figure 2A:
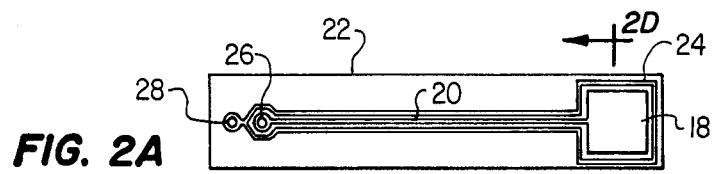
FIG. 2A is a top view of the sense head.
Figure 2B:
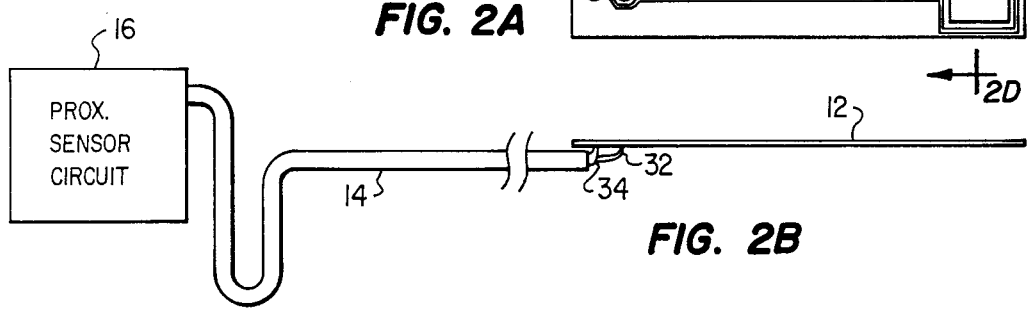
FIG. 2B is a side view of the sense head and other components constituting the subject matter of the invention.

Referring now to FIG. 2B, the capacitive sensor includes a printed circuit board sense head means 12 connected by a coaxial cable 14 to a capacitive proximity sensor circuit 16.

Figure 1:
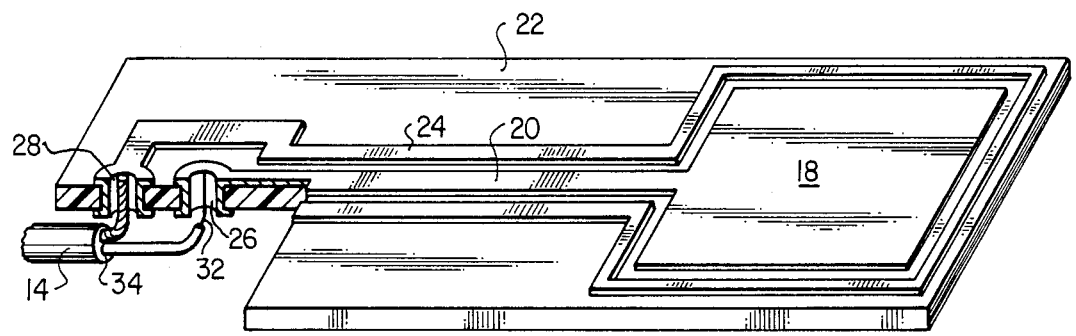
FIG. 1 is an isometric view of the sense head with a cut-away section to show electrical connections.
Figure 2C:
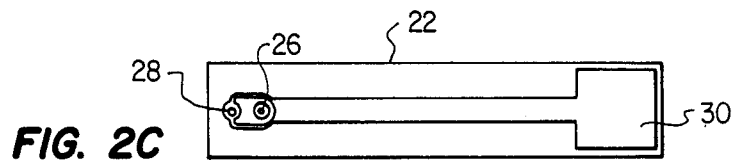
FIG. 2C is a bottom view of the sense head.

The printed circuit board sense head 12 (FIGS. 1 and 2A) includes two conductive but non-connecting portions formed on the first or top side of dielectric substrate 18 (FIG. 1). The first protion includes a sense electrode area 18 formed together with a conductive lead 20 on a substrate 22; the second portion is a guard ring 24 surrounding the sense head area and its conductive lead. The substrate 22 has conductive feed through apertures 26 and 28 electrically connected, respectively, to the conductive lead 20 and guard ring 24. A guard shield 30 (FIG. 2C) is formed on a second or bottom surface of the substrate in electrical contact with the conductive feed through aperture 28. The guard shield 30 is correspondingly positioned on the bottom surface to correspond to the position of the sense electrode 18 and its conductive lead 20 on the substrate top surface with its dimensions in excess thereof to reduce substantially any edge effects.

The sense electrode 18 and its conductive lead 20, the guard ring 24, and guard shield 30, are formed on the thin substrate 22 of dielectric material such as, for example, a copper clad phenolic resin using the well known photolithographic process to pattern the elements on the copper plates and etch away the copper to leave these elements. In this manner a printed circuit board sense head is provided.

The coaxial cable 14 (FIGS. 1 and 2B) has an inner conductor 32 and an outer conductor 34 having first and second ends. The inner conductor 32 and outer conductor 34 first ends are connected, respectively, through the conductive feed through aperture 26 to the conductive lead 20 and through the second feed through aperture 28 (FIGS. 1 and 2B) to guard ring 24 and to the guard shield 30. The second ends of the coaxial cable are connected to the capacitive proximity sensor circuit 16 for energizing the sense electrode 18, guard ring 24, and guard shield 30. A suitable capacitive proximity sensor circuit 16 is, for example, the circuit disclosed in U.S. Pat. No. 4,654,603 issued Mar. 31, 1987 for a Low Input-Capacitance Amplifier For Driving Guard Shield Conductors.

It will be appreciated by those persons skilled in the art that the sense head may alternatively be a printed flex circuit board.

Figure 2D:
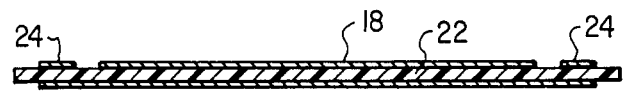
FIG. 2D is a cross-sectional view of the sense head taken along line 2D—2D of FIG. 2A.
Figure 3:
FIG. 3 is a cross-sectional view of a parts handling mechanism having the sense head cemented in a milled slot.

In operation, for example, the printed circuit board sense head means 12 is cemented with an epoxy into a milled slot of a parts handling mechanism 36 (FIG. 3). Electrical power from the capacitive proximity sensor circuit 16 (FIG. 2B) is supplied through the inner conductor 32 (FIG. 1) of the coaxial cable 14 to the sense electrode 18 and through the outer conductor 34 of the coaxial cable to the guard ring 24 and guard shield 30. In order to prevent the capacitance that exists between the inner conductor 32 and outer shield 34 from loading the signal of inner conductor 32, the capacitive proximity sensor sircuit 16 impresses on outer shield conductor 34 a low impedance ac voltage which is substantially identical to the ac voltage of the signal on the inner conductor 32. Similarly, the signal on sensing electrode 18, which is the signal on inner conductor 32, would be subject to capacitive loading through dielectric 22 except that such loading is prevented by the guard signal on outer shield conductor 34 which is applied to guard ring 24 and guard shield 30. The thinness of the dielectric substrate 18 with respect to the other dimensions of the laminate capacitive sense head printed circuit board device permits the guarding provided by the guard ring 24 and guard shield 28 to be highly effective. That is, very little capacitive loading to ground of the sense electrode 18 occurs through the dielectric in the gap between guard ring 24 and guard shield 30 and from the center conductor to ground; this is significant because this capacitive loading is the quantity being monitored by the circuit to detect the presence of an object at the sense head. When an object is near the sense electrode 18, an output signal of circuit 16 indicates the presence of an object; any material can be sensed and output signals produced that interface directly with other control systems. FIG. 2D shows a cross-sectional view of FIG. 2A. Sense electrode 18 fabricated on substrate 22 in relationship to guard ring 24.

The distance from the sense head to the object being sensed is adjustable from near zero to some maximum value depending upon the size and location of the sense head and the size and material of the object being sensed. If the sense head is mounted in a grounded metal plate with the sensing surface flush with the surface of the metal plate, a typical sensing distance is about $\frac{1}{3}$ the diameter or breadth of the sense electrode area. The sensed object needs to be large with respect to the sense electrode, and conductive materials can be sensed at greater distances than non-conductive materials. Because the sense head contains no active electronic parts it can be made to operate in hostile environments such as high temperature; the sense head can be very small and in different shapes to accommodate special applications.

Although a single embodiment of the invention has been described, it will be apparent to a person skilled in the art that various modifications to the details of construction shown and described may be made without departing from the scope of the invention.

What is claimed is:

1. A capacitive sensor comprising:
   a capacitive proximity sensor circuit means for producing low impedance ac voltages and for detecting capacitive loading of a sense head; and
   a printed circuit board sense head means including a substrate, a sense electrode layered on the substrate, and electrically driven guard shields layered on said substrate for shielding the sense electrode, said sense head means being remotely connected by an electrical lead means to the capacitive proximity sensor circuit means for receiving the low impedance ac voltages for capacitively coupling objects present and for reducing substantially the capacitance of the sense electrode capacitance to ground thereby preserving the capacitance loading quantity being monitored to detect the presence of an object.

2. A capacitive sensor according to claim 1 wherein the printed circuit board sense head means includes a substrate of dielectric material having a thickness sized to fit in very thin mechanisms and first and second opposing surfaces, said first surface having formed thereon a flat sense electrode adjacent a first end thereof, a conductive lead operatively connected to the sense electrode and terminating adjacent to a second end of the substrate, and a conductive guard ring in a spaced relationship to the perimeter forming edges of the sense electrode and conductive lead, said sense electrode forming a sense area, said second surface having formed thereon a flat conductive guard shield corresponding substantially at least to the shape of the sense electrode and its conductive lead and located there beneath, and wherein the electrical lead means is a coaxial cable having inner and outer conductors having first and second ends, the inner and outer conductor's first ends operatively connected, respectively, to the sense electrode's conductive lead, and to the guard ring and guard shield, and the inner and outer conductor's second ends operatively connected to the capacitive proximity sensor circuit means whereby the sense head means is remotely connected to the capacitive proximity sensor circuit means.

3. A capacitive sensor according to claim 2 wherein the dielectric substrate includes first and second conductive feed through apertures for connecting the first and second conductors, respectively, to the head sense electrode conductive lead and guard ring.

4. A capacitive sensor according to claim 2 wherein the sense electrode is configured in a size and shape to accommodate various object detection applications.

5. A capacitive proximity sensor including a capacitive sense head, a shielded electrical conductor means having an inner conductor and an outer shield conductor operatively connected to the capacitive sense head, and a capacitive proximity sensor circuit operatively connected to the inner conductor and to the outer shield conductor of the shielded electrical conductor means for driving the outer shield conductor with a low impedance ac voltage substantially identical in magnitude and phase to an ac signal on the inner conductor, said signal being monitored to detect capacitive loading due to objects in proximity of the sense head, the improvement characterized in that the capacitive sense head comprises a laminate structure including;

a layer of dielectric material having first and second opposing sides;

said first opposing side of dielectric material having a layer of electrically conductive material in first and second non-connecting portions, the first portion having an area serving as a sense electrode and being operatively connected to the inner conductor of the shielded electrical conductor means, the second portion serving as a guard ring configured to substantially surround the perimeter of the first portion and being operatively connected to the outer shield conductor of the electrical conductor means; and said second opposing side of the dielectric material having a layer of electrically conductive material, said layer serving as a guard shield operatively connected to the outer shield conductor of the shielded electrical conductor means and being configured to cover an area at least directly opposite the first portion of the first layer.

6. A capacitive proximity sensor according to claim 5 wherein the laminate capacitive sense head is a printed flex circuit board.

* * * * *